(12) United States Patent
Senda et al.

(10) Patent No.: US 9,991,456 B2
(45) Date of Patent: Jun. 5, 2018

(54) DISPLAY DEVICE

(71) Applicant: Japan Display Inc., Minato-ku (JP)

(72) Inventors: Megumi Senda, Minato-ku (JP);
Naohisa Andou, Minato-ku (JP);
Kazuto Tsuruoka, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days. days.

(21) Appl. No.: 15/709,718

(22) Filed: Sep. 20, 2017

(65) Prior Publication Data

US 2018/0090701 A1 Mar. 29, 2018

(30) Foreign Application Priority Data

Sep. 27, 2016 (JP) .................. 2016-188348

(51) Int. Cl.
*H01L 51/00* (2006.01)
*H01L 27/32* (2006.01)

(52) U.S. Cl.
CPC ...... *H01L 51/0097* (2013.01); *H01L 27/3276* (2013.01); *H01L 2251/5338* (2013.01)

(58) Field of Classification Search
CPC ............. H01L 51/0097; H01L 27/3276; H01L 2251/5338
See application file for complete search history.

(56) References Cited

U.S. PATENT DOCUMENTS 9,276,055 B1 * 3/2016 Son ..................... H01L 27/3276

FOREIGN PATENT DOCUMENTS

JP 2007-027222 2/2007

* cited by examiner

*Primary Examiner* — Kyoung Lee
(74) *Attorney, Agent, or Firm* — Oblon, McClelland, Maier & Neustadt, L.L.P.

(57) ABSTRACT

To provide a display device including a spacer, a flexible substrate having a wire extending from a terminal area to a display area, and a reinforcement film having a first reinforcement attached on the rear side of the display area, a second reinforcement attached on the display side of the terminal area, a bending reinforcement attached on the respective both edge portions in the width direction of the flexible substrate on the inside surface side of the bending area, and an opening surrounded by the first reinforcement, the second reinforcement, and the bending reinforcement, wherein the opening has a shape of which width becomes larger as it goes from respective end sides to center in the width direction of the reinforcement film.

9 Claims, 14 Drawing Sheets

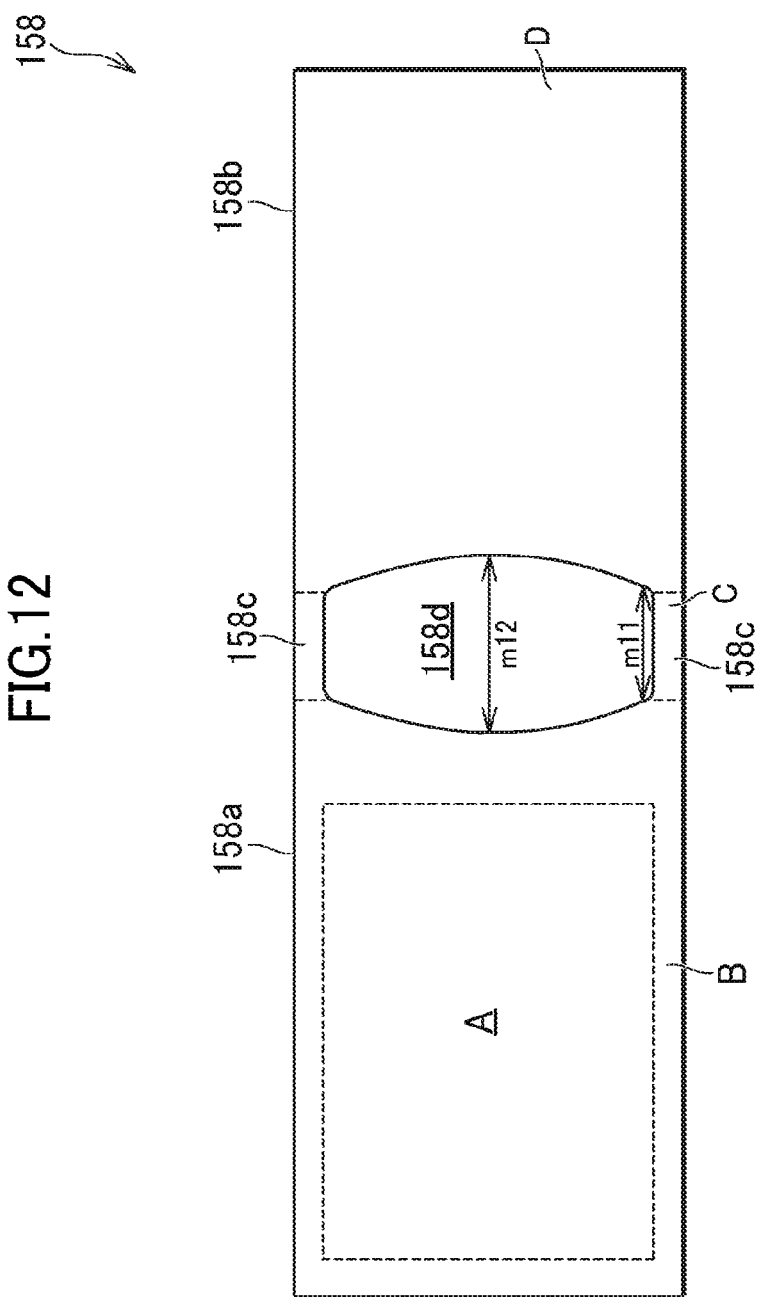

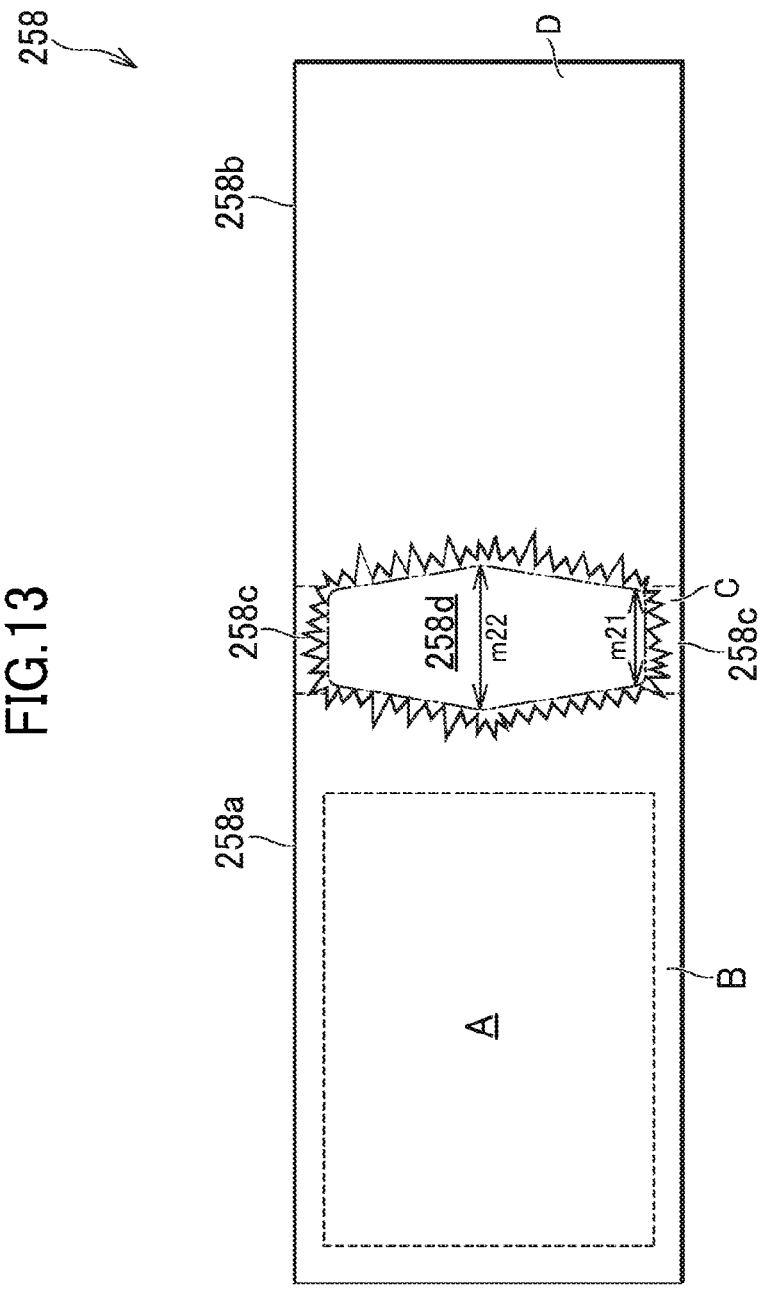

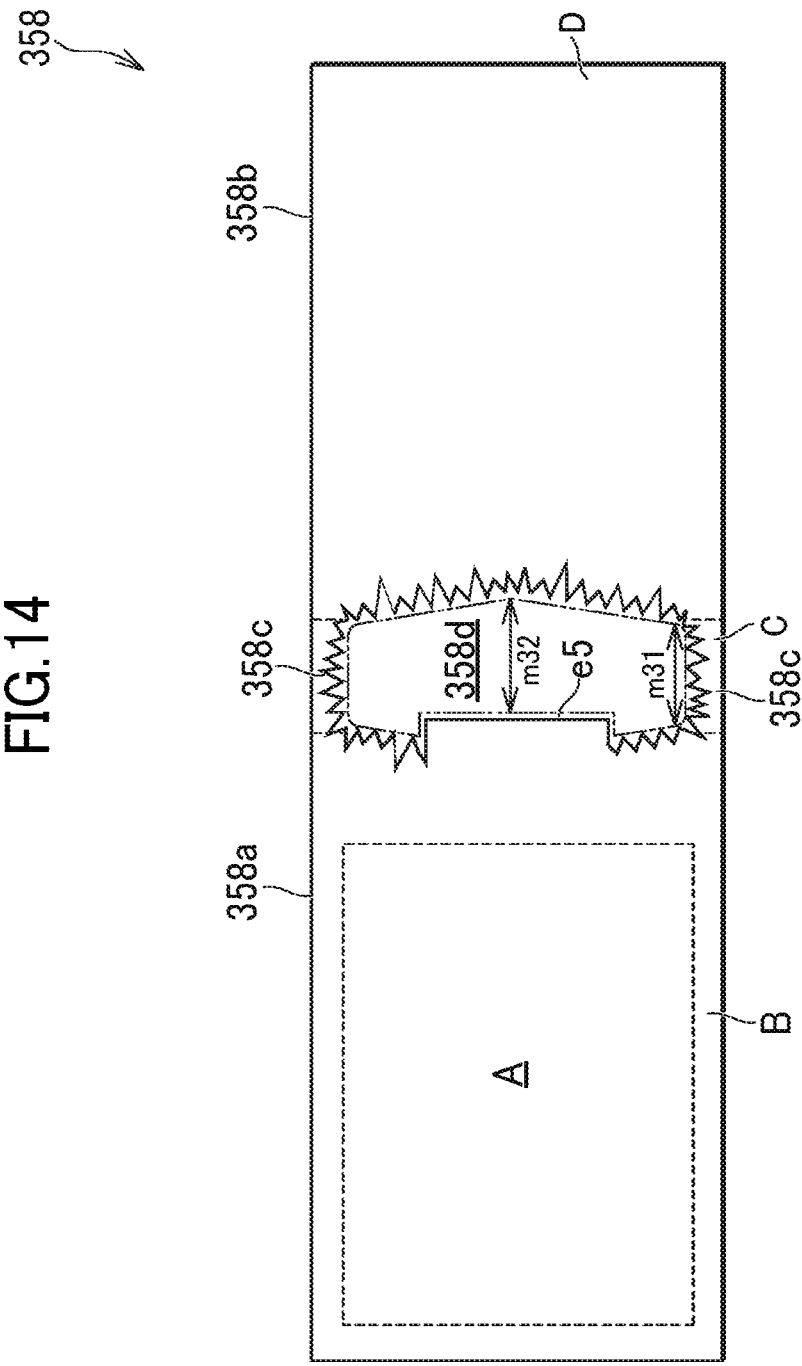

DISPLAY DEVICE

CROSS-REFERENCE TO RELATED APPLICATION

The present application claims priority from Japanese application JP2016-188348 filed on Sep. 27, 2016, the content of which is hereby incorporated by reference into this application.

BACKGROUND OF THE INVENTION

1. Field of the Invention

The present invention relates to a display device.

2. Description of the Related Art

In recent years, there has been an increasing demand for reduction in size of an area, or a frame area, around a display area (a narrow frame) to thereby reduce the size of a display device or to enlarge the display area for image display. In particular, a demand for a narrower frame in a mobile device such as a smart phone has been increasing.

In view of the above, use of a flexible substrate having flexibility has been considered so that the area outside the display area bends in the direction with the rear surface of the display area to thereby reduce the size of the frame area. On the area outside the display area, a wire and a circuit are mounted. In bending the flexible substrate, stress will act on in a bending area, which can disconnect or damage the wire or the like. To address the above, JP2007-027222A, for example, discloses a structure including a regulation film to prevent disconnection or other damages of wires.

The inventor of the present invention has considered a structure in which a reinforcement film is attached on the inner surface side of the flexible substrate to modify the load acting on the flexible substrate. When such a reinforcement film is attached over the entire bending area of the flexible substrate, however, the reinforcement film can be damaged as being intolerable to the stress that acts on the reinforcement film when the flexible substrate is bent. To address the above, the inventor has considered a structure in which a reinforcement film is attached only on the both edge portions in the width direction in the bending area of the flexible substrate, that is, a structure in which an opening is formed in the reinforcement film in an area corresponding to the bending area. In such a structure, an area with the reinforcement film attached thereon and an area without the reinforcement film are resulted because of the presence of the opening in the reinforcement film, and load can be generated on the flexible substrate locally along the boundary between the area with the reinforcement film and the area without the reinforcement film.

SUMMARY OF THE INVENTION

It is an object of the present invention to provide a display device with less load generated in a flexible substrate.

According to one aspect of the present invention, there is provided a display device including a spacer; a flexible substrate on which a display area for image display, a frame area, a bending area, and a terminal area having a terminal are arranged in this order, and which includes a wire extending from the terminal area to the display area, the bending area being bent in conformity with a shape of the spacer to thereby place the terminal area on a rear side of the spacer; and a reinforcement film including a first reinforcement attached on a rear side of the display area, a second reinforcement attached on a display side of the terminal area, a bending reinforcement attached on respective both edge portions in a width direction of the flexible substrate on an inside surface side of the bending area, and an opening surrounded by the first reinforcement, the second reinforcement, and the bending reinforcement, wherein the opening has a shape of which width becomes larger as the width goes from respective end sides to center in a width direction of the reinforcement film.

BRIEF DESCRIPTION OF THE DRAWINGS

FIG. 12 is a plan view of a modified example of a rear reinforcement film;

FIG. 13 is a plan view of a modified example of a rear reinforcement film; and FIG. 14 is a plan view of a modified example of a rear reinforcement film.

DETAILED DESCRIPTION OF THE INVENTION

The following describes respective embodiments of the present invention, with reference to the drawings.

In the respective embodiments of the present invention, in description of an aspect in which a component is disposed "on" another component, a simple description of being "on" refers not only to a case in which a component is disposed directly, that is, in contact with, the other component, but also to a case in which a component is disposed above the other component with a still another component intervening, unless otherwise stated.

Figure 1:
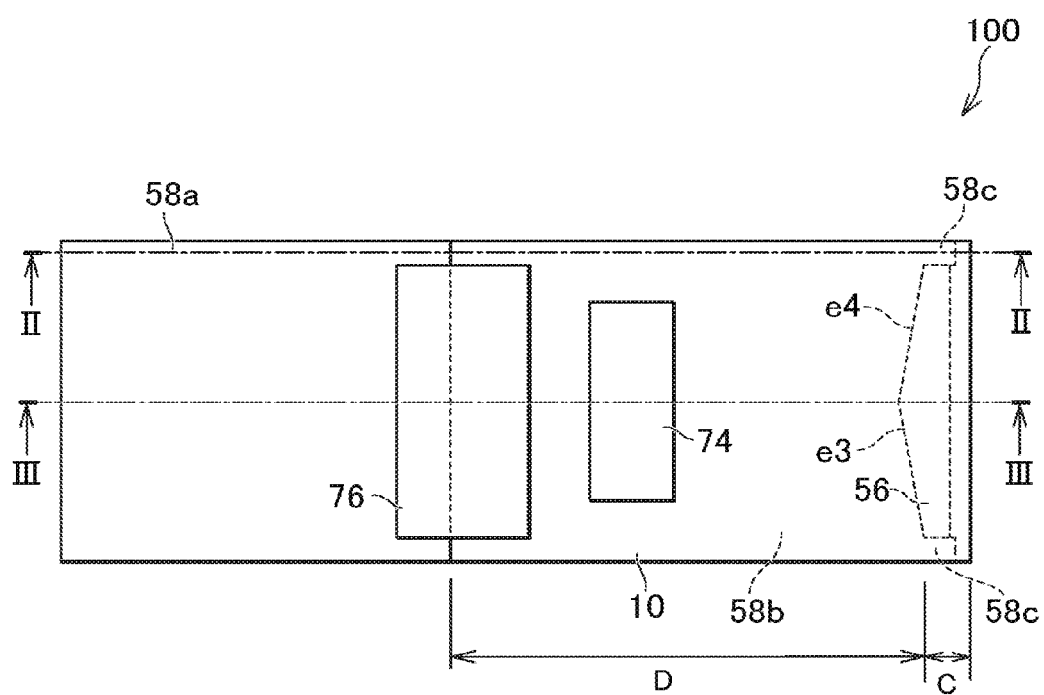
FIG. 1 is a plan view of a display device according to a first embodiment viewed from the rear side.
Figure 2:
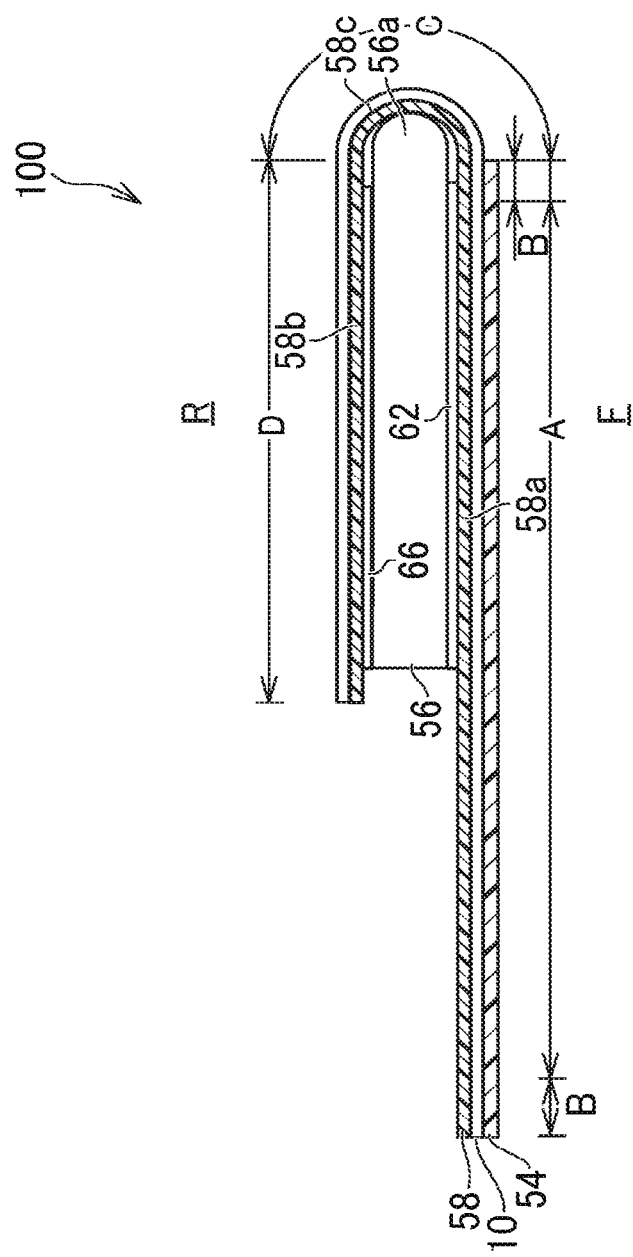
FIG. 2 is a cross sectional view along the line II-II in FIG. 1.
Figure 3:
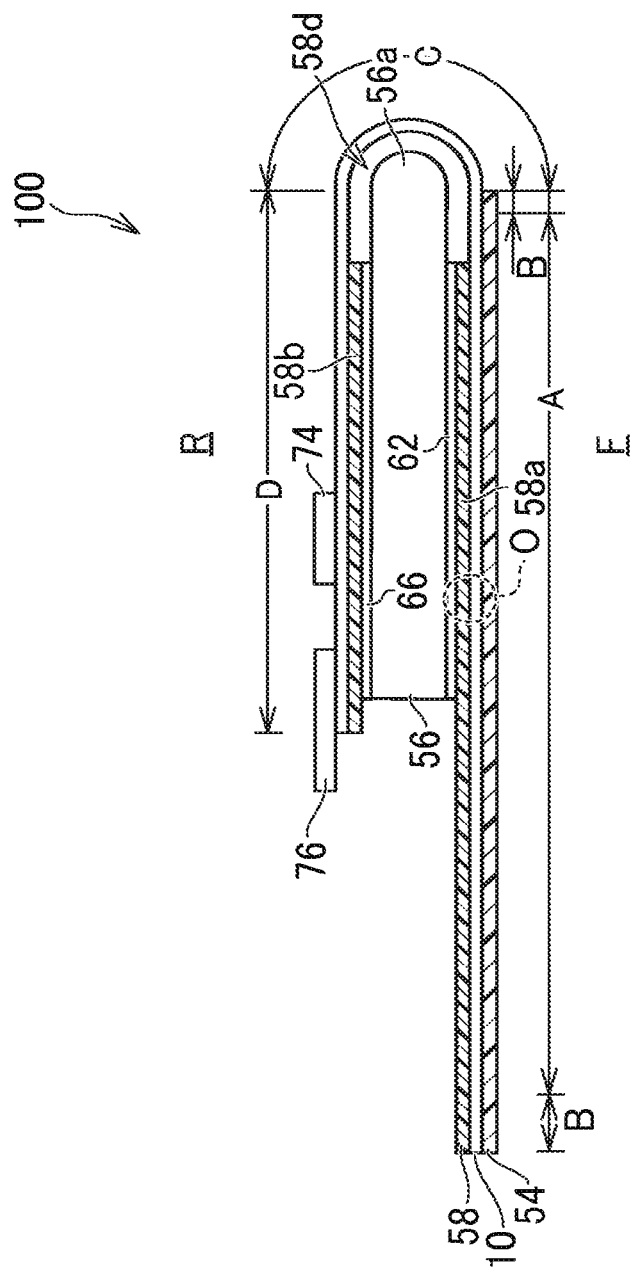
FIG. 3 is a cross sectional view along the line in FIG. 1.
Figure 4:
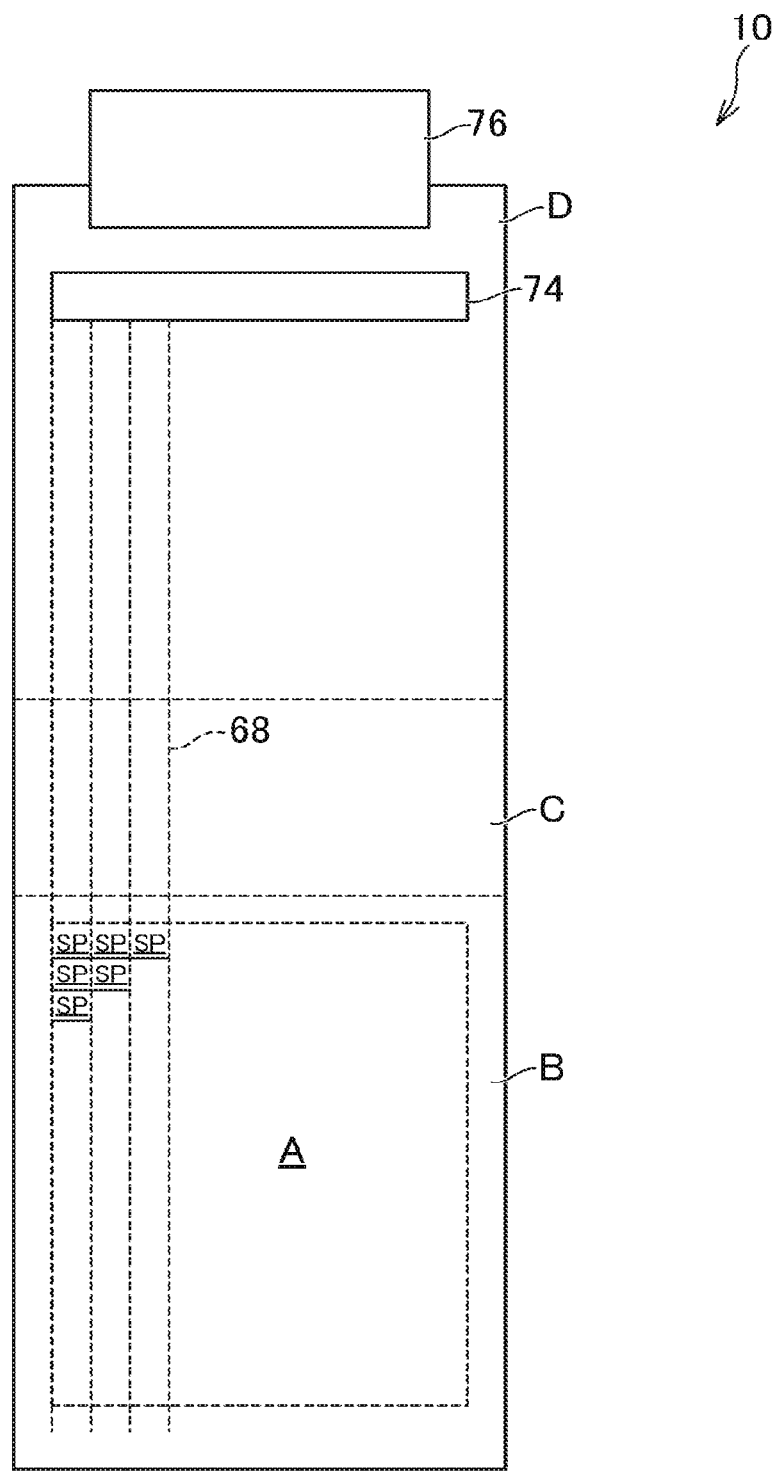
FIG. 4 is a plan view of pixel disposition, for example, on a flexible substrate.

FIG. 1 is a plan view of a display device according to a first embodiment viewed from the rear side. FIG. 2 is a cross sectional view along the line II-II in FIG. 1. FIG. 3 is a cross sectional view along the line in FIG. 1. Assume in the following description that a side relative to a flexible substrate 10 on which an image is displayed in a display area A is defined as a display side F, while the side opposite from the display side F is as a rear side R. FIG. 4 is a plan view of pixel disposition on the flexible substrate in an extending state. As illustrated in FIG. 4, pixels P are arranged in a matrix in the display area A of the flexible substrate 10. The pixels P are arranged over the substantially entire display area A although only some of the pixels P are illustrated in FIG. 4. The flexible substrate 10 has wires 68 or other lines thereon, such as a signal line extending from the terminal area D via a bending area C to the display area A. The display area A, a frame area B, the bending area C, and the terminal area D in the flexible substrate 10 will be described later in detail.

In the first embodiment, an organic electro-luminescence display device as an example of a display device 100 will be described, although any display device including a flexible substrate 10, such as a liquid crystal display device, is similarly applicable. The display device 100 includes unit pixels SP (sub-pixels) for a plurality of colors, including red, green, and blue, that together constitute a pixel P (pixel) for full color to display an image in full color.

Figure 5:
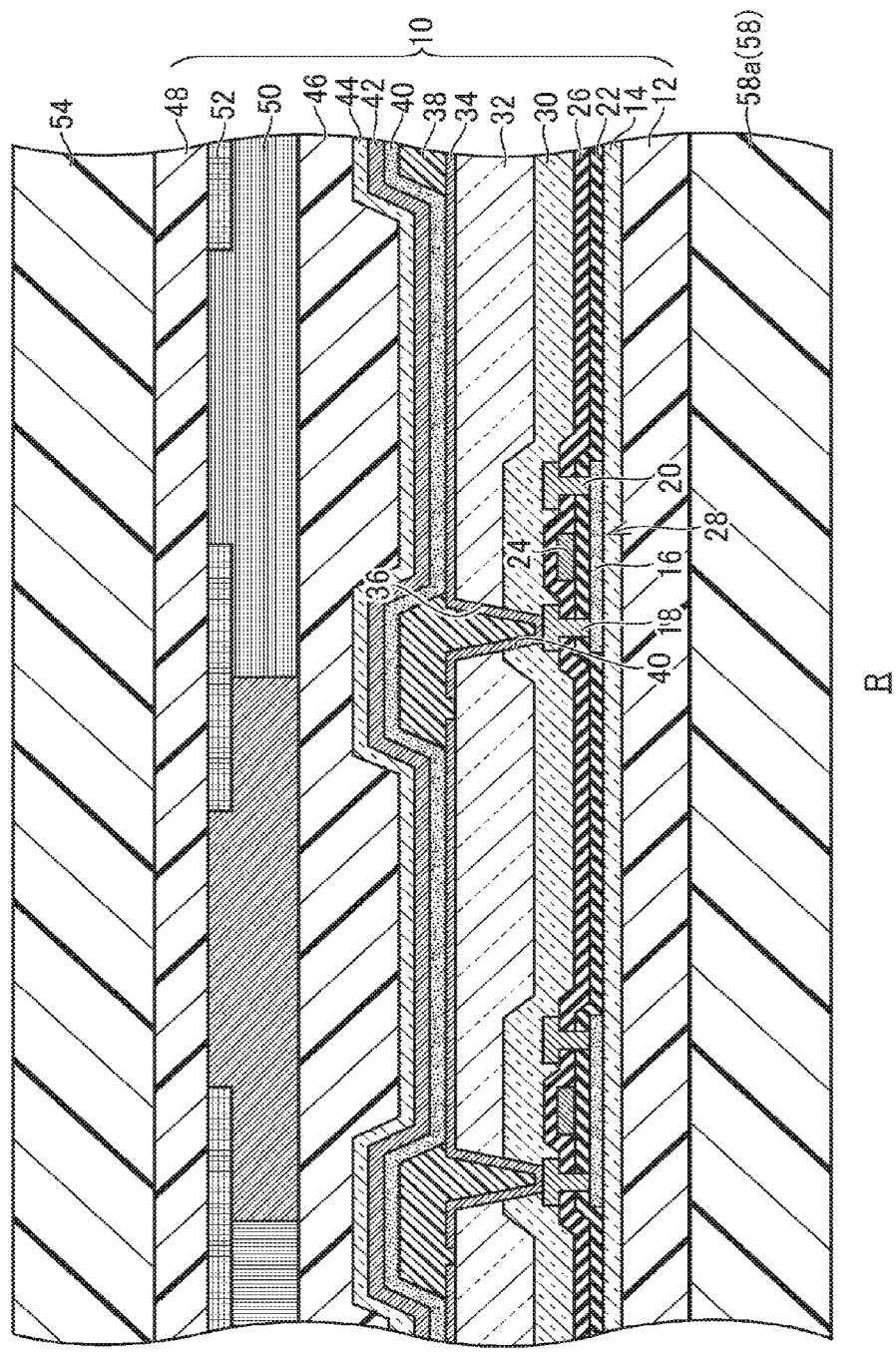
FIG. 5 is an enlarged cross sectional view of the part in the circle O indicated by a broken line in FIG. 3.

As illustrated in FIG. 1 to FIG. 3, the display device 100 includes the transparent flexible substrate 10 having flexibility. The following describes details on the flexible substrate 10 and its peripheral structure, with reference to FIG. 5. FIG. 5 is an enlarged cross sectional view of the part in the circle O indicated by a broken line in FIG. 3.

As illustrated in FIG. 5, the flexible substrate 10 includes a first substrate 12 made of resin. The first substrate 12 has an undercoat 14 thereon that functions as a barrier against impurities contained in the first substrate 12. A semiconductor layer 16 is formed on the undercoat 14. The semiconductor layer 16 is electrically connected to a source electrode 18 and a drain electrode 20, and covered by a gate insulating film 22. A gate electrode 24 is formed on the gate insulating film 22. The gate electrode 24 is covered by an interlayer insulating film 26. The source electrode 18 and the drain electrode 20 penetrate the gate insulating film 22 and the interlayer insulating film 26. The semiconductor layer 16, the source electrode 18, the drain electrode 20, and the gate electrode 24 together constitute a thin film transistor 28. The thin film transistor 28 is covered by a passivation film 30.

A planarization layer 32 is formed on the passivation film 30. A plurality of pixel electrodes 34 (for example, positive electrodes) are formed on the planarization layer 32 so as to correspond to the plurality of respective unit pixels. The planarization layer 32 is formed such that the surface thereof where at least the pixel electrodes 34 are formed makes a flat surface. The pixel electrode 34 is electrically connected to one of the source electrode 18 and the drain electrode 20 on the semiconductor layer 16 through a contact hole 36 that penetrates the planarization layer 32 and the passivation film 30.

An insulating layer 38 is formed on the planarization layer 32 and the pixel electrode 34. In particular, the insulating layer 38 is formed on a peripheral portion of the pixel electrode 34 such that a part (for example, a middle portion) of the pixel electrode 34 is left open. That is, the insulating layer 38 constitutes a bank that surrounds a part of the pixel electrode 34.

A light emitting element layer 40 is formed on the pixel electrode 34. Specifically, the light emitting element layer 40 is formed successively from the plurality of pixel electrodes 34, and formed also on the insulating layer 38. Alternatively, the light emitting element layer 40 may be formed separately (discrete) for every pixel electrode 34. The light emitting element layer 40 formed discrete emits light in blue, red, or green so as to correspond to the respective pixels. In this case, a color filter to be described later is unnecessary. The light emitting element layer 40 includes at least a light emitting layer, and may additionally include at least one of an electron transport layer, a hole transport layer, an electron injection layer, and a hole injection layer.

On the light emitting element layer 40, a common electrode 42 (for example, a negative electrode) is formed in contact with the light emitting layer 40 above the plurality of pixel electrodes 34. The common electrode 42 is formed above the insulating layer 38 constituting a bank. The light emitting element layer 40 is held between the pixel electrode 34 and the common electrode 42, and emits light with luminance controlled by a current flowing across the pixel electrode 34 and the common electrode 42.

The light emitting element layer 40 is covered, and thereby sealed, by a sealing layer 44 formed on the common electrode 42 to be thereby shut off from water. A second substrate 48 is formed on the sealing layer 44 via a filler layer 46. A colored layer 50 for a plurality of colors (for example, blue, red, and green) is formed on the second substrate 48, and a black matrix 52 made of metal, resin, or the like, is disposed between differently colored adjacent segments of the colored layer 50, whereby a color filter is constituted. The second substrate 48 may be a touch panel or may have a polarizer plate or a phase differential plate.

Figure 6:
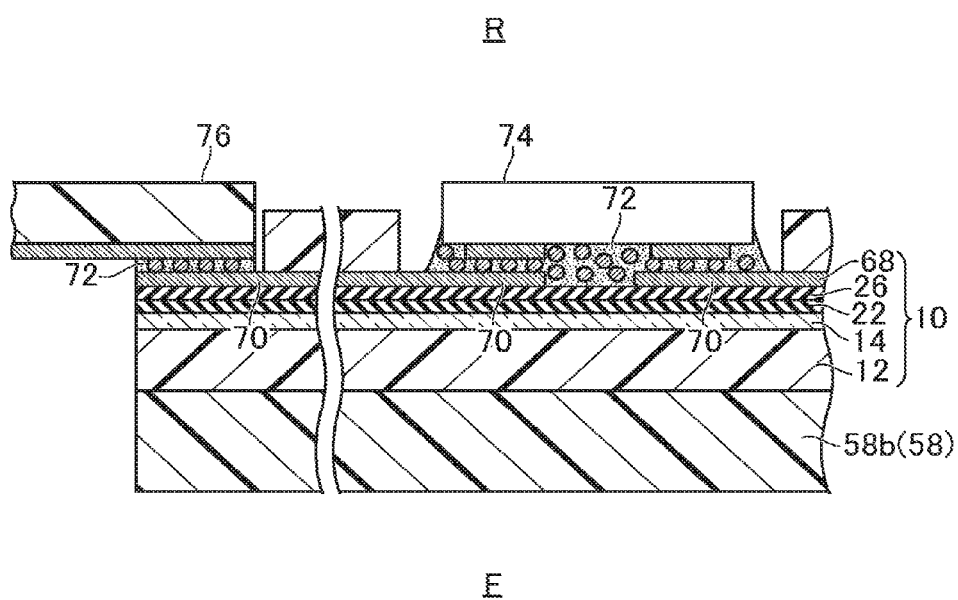
FIG. 6 is an enlarged cross sectional view of an area near an end portion of a terminal area of a flexible substrate.

FIG. 6 is an enlarged cross sectional view of an end portion and its near portion in the terminal area D of the flexible substrate 10 (see FIG. 3 or the like). A wire 68 is mounted on the terminal area D. The wire 68 is formed in the same layer as the layer with, for example, the source electrode 18 and the drain electrode 20, and extends from the terminal area D via the bending area C and the frame area B to the display area A. The wire 68 includes a terminal 70 that is electrically connected via an anisotropic conductive film 72 to an integrated circuit chip 74 or a Flexible Printed Circuits (FPC) substrate 76. The integrated circuit chip 74 may be formed on and electrically connected to the FPC substrate 76.

Figure 7:
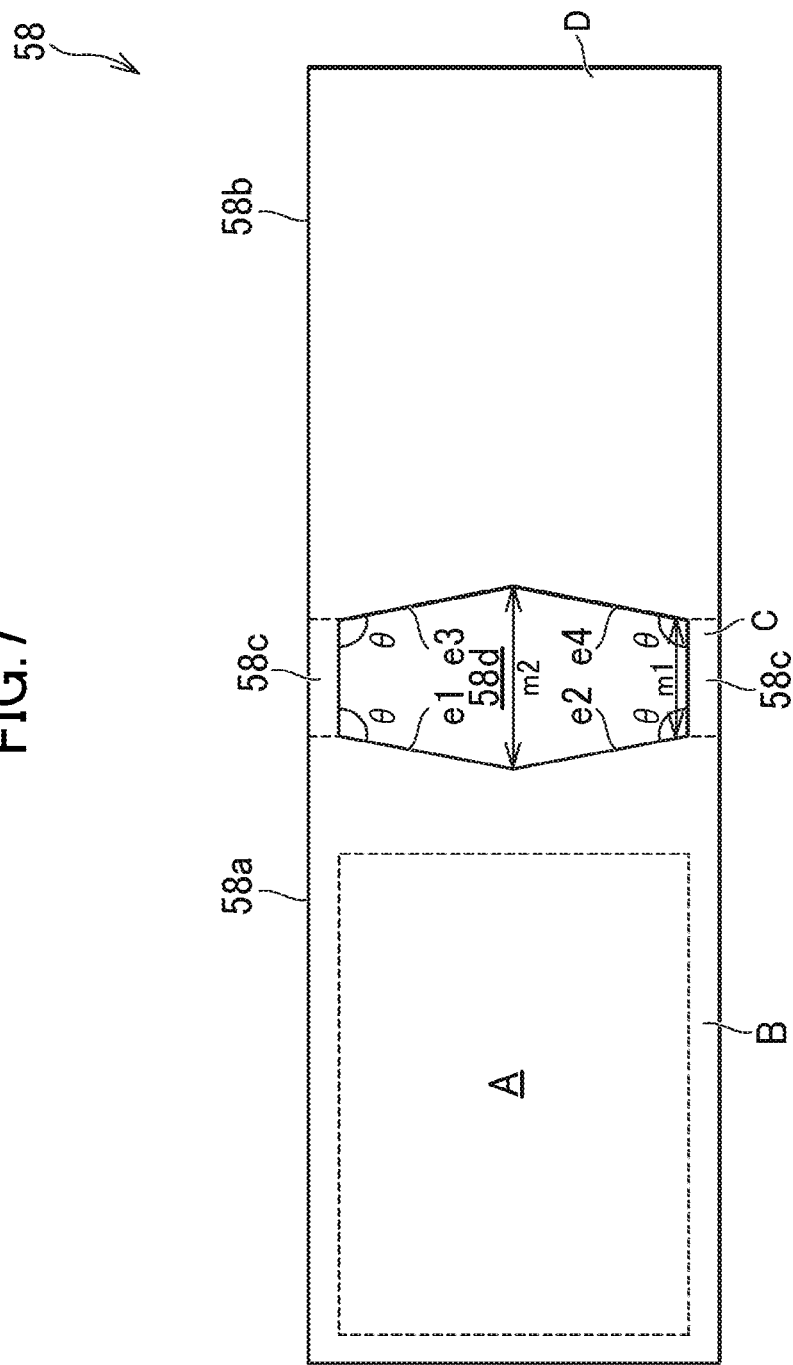
FIG. 7 is a plan view of a rear reinforcement film.
Figure 8:
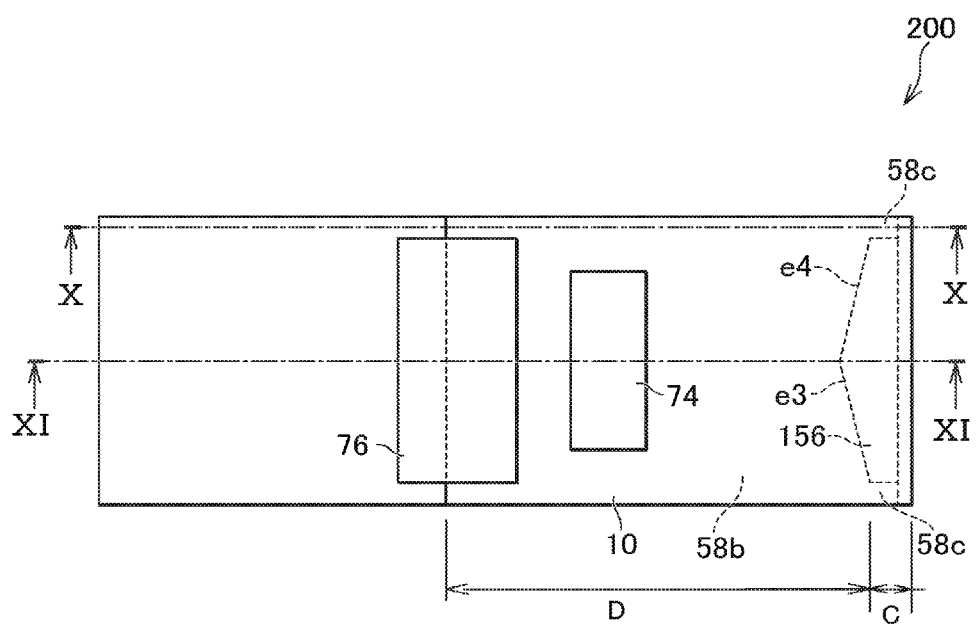
FIG. 8 is a plan view of a display device according to a second embodiment viewed from the rear surface.

With reference to FIGS. 1 to 3 and FIG. 7, the entire structure of the display device 100 according to the first embodiment will be described. FIG. 7 is a plan view of a rear reinforcement film in an extending state (before bending). The letters A to D in FIG. 7 indicate respective sections (sections for attachment) in the rear reinforcement film 58 that correspond to the display area A, the frame area B, the bending area C, and the terminal area D, respectively, of the flexible substrate 10 illustrated in FIGS. 1 to 3.

As illustrated in FIGS. 1 and 3, besides the flexible substrate 10, the display device 100 includes a spacer 56, a front reinforcement film 54, the rear reinforcement film 58, the integrated circuit chip 74, and the FPC substrate 76. The front reinforcement film 54 and the rear reinforcement film 58 protect and reinforce the flexible substrate 10. The spacer 56 guides the flexible substrate 10 in bending.

The flexible substrate 10 includes the display area A for image display, the frame area B around the display area A, the bending area C, and the terminal area D having a terminal, arranged in this order. The frame area B fully surrounds the display area A in a plan view. The bending area C is bent in conformity with the shape of a guide portion 56a of the spacer 56. The bending of the bending area C places the terminal area D on the rear side R of the spacer 56.

The front reinforcement film 54 is attached on the display side F of the display area A and the frame area B on the flexible substrate 10, but not in the bending area C, as illustrated in FIG. 2 or other figures.

The rear reinforcement film 58 includes a first reinforcement 58a, a second reinforcement 58b, and a bending reinforcement 58c. As illustrated in FIGS. 1 to 3, the first reinforcement 58a is to be attached on the rear side R of the display area A; the second reinforcement 58b is to be attached on the display side F of the terminal area D; and the bending reinforcement 58c is to be attached on each edge portion in the width direction of the flexible substrate 10 on the inside surface side of the bending area C. The rear reinforcement film 58 has an opening 58d defined by the first reinforcement 58a, second reinforcement 58b, and bending reinforcement 58c surrounding the opening 58d. FIG. 2 illustrates a cross section passing through the bending reinforcement 58c. FIG. 3 illustrates a cross section passing through the opening 58d.

On the inner surface side of the bending flexible substrate 10, stress (a contraction stress) is caused acting on in the longitudinal direction (in the up-down direction in FIG. 4) of the flexible substrate 10 in an extending state.

In the first embodiment, as illustrated in FIG. 7, the opening 58d has a shape of which width becomes larger as it goes from the respective end sides to center in the width direction of the rear reinforcement film 58. Specifically, the inside surface of the opening 58d is constituted by end faces e1 to e4 each are inclined relative to the direction in which the stress caused by bending the flexible substrate 10 acts on. This results in the hexagonal shape of the opening 58d, as illustrated in FIG. 7.

The end faces e1 and e2, which constitute a part of the inside surface of the opening 58d, are end faces of the first reinforcement 58a. The end face e1 is inclined so as to approach the bending area C as it goes from the center to one end side (the left side in FIG. 7) in the width direction of the rear reinforcement film 58, while the end face e2 is inclined so as to approach the bending area C as it goes from the center to the other end side (the right side in FIG. 7) in the width direction of the rear reinforcement film 58.

The end faces e3 and e4, which constitute a part of the inside surface of the opening 58d, are end faces of the second reinforcement 58b. The end face e3 is inclined so as to approach the bending area C as it goes from the center to one end side (the left side in FIG. 7) in the width direction of the rear reinforcement film 58, while the end face e4 is inclined so as to approach the bending area C as it goes from the center to the other end side (the right side in FIG. 7) in the width direction of the rear reinforcement film 58.

The end faces e1 and e2 are symmetrical to each other in the width direction of the rear reinforcement film 58, while the end faces e3 and e4 are symmetrical to each other in the width direction of the rear reinforcement film 58. That is, the opening 58d has a symmetrical shape in the width direction of the rear reinforcement film 58.

As illustrated in FIGS. 2 and 3, the second reinforcement 58b of the rear reinforcement film 58 is attached on the surface of the spacer 56 on the rear side R by an adhesive member 66, while the first reinforcement 58a of the rear reinforcement film 58 is attached on the surface of the spacer 56 on the display side F by an adhesive member 62. The adhesive members 62 and 66 may be made of viscous resin, or may be a double stick tape, or the like. The bending reinforcement 58c is not attached on the spacer 56 by an adhesive member, as illustrated in FIG. 2, although an adhesive member may be applied to the guide portion 56a of the spacer 56. Alternatively, for example, an adhesive member made of viscous resin may be filled in the opening 58d such that the bending area C of the flexible substrate 10 is directly attached to the guide portion 56a of the spacer 56 through the opening 58d.

As illustrated in FIG. 2, the spacer 56 has a cross sectional shape that is partially defined by the round shape of the guide portion 56a that guides the bending area C of the flexible substrate 10 in bending. This shape makes the wire 68 or the like unlikely to be disconnected or damaged in the bending area C of the flexible substrate 10.

In the first embodiment, provision of the rear reinforcement film 58 inside the bending of the flexible substrate 10 can modify the stress caused in the flexible substrate 10, and prevent disconnection or other damages of the wire 68 on the flexible substrate 10. Furthermore, disposition of the bending reinforcement 58c in the bending area C, that is, an area where stress is most likely caused, can more likely modify the stress.

In the above, however, there is a possibility that load be generated on the flexible substrate 10 locally along the boundary between a part with the rear reinforcement film 58 attached thereon and a part without the rear reinforcement film 58. The locally generated load on the flexible substrate 10 can disconnect or damage the wire 68 or the like. In particular, when the direction in which the wire 68 extends is orthogonal to the direction in which each of the end faces e1 to e4 extends, larger load is expected to be generated in the wire 68 or the like. In the first embodiment, as the direction in which each of the end faces e1 to e4 extends is inclined relative to the direction in which the wire 68 extends, load to be locally generated in the wire 68 is reduced. Furthermore, the longer the boundary between a part of the flexible substrate 10 with the rear reinforcement film 58 attached thereon and a part without the rear reinforcement film 58 is, the more the load generated at the boundary on the flexible substrate 10 is dispersed and the more load to be generated in each wire 68 is reduced. In the first embodiment, as the end faces e1 to e4, that make the boundary, are long, load to be generated in each wire 68 is reduced, as compared with a case in which the direction in which the end face that makes the boundary extends is orthogonal to the direction in which the wire 68 extends. As a result, it is possible to reduce occurrence of failed lighting or other defects of the light emitting elements in the display area A due to disconnection or damage of the wire 68 or other causes.

In the first embodiment, as illustrated in FIG. 7, in the rear reinforcement film 58, the angle S of a corner defined by each of the end faces e1 to e4 and an end face of the bending reinforcement 58c that defines a part of the opening 58d is an obtuse angle. This angle makes stress unlikely to be caused locally at each corner of the opening 58d on the flexible substrate 10. The angle θ is defined as about 120 degrees in the first embodiment, although the angle θ may be any angle without limitation.

The display device 100 may be fabricated following the procedure described below. Specifically, the rear reinforcement film 58 is initially attached to the flexible substrate 10. Then, after preparation of the spacer 56, the adhesive member 62 is applied to a surface of the spacer 56 on the display side F, and the adhesive member 66 is applied to a surface of the same on the rear side R. The spacer 56 is then placed on the first reinforcement 58a of the rear reinforcement film 58 attached on the flexible substrate 10, and fixed to the flexible substrate 10 by the adhesive member 62. Subsequently, the bending area C and the bending reinforcement 58c are bent in conformity with the shape of the guide portion 56a of the spacer 56, whereby the terminal area D is placed on the rear side R of the spacer 56. Then, the second reinforcement 58b of the rear reinforcement film 58 is fixed to the surface of the spacer 56 on the rear side R by the adhesive member 66. With the above, the bending area C of the flexible substrate 10 is held in a bending state.

The following describes a display device 100 according to a second embodiment with reference to FIGS. 8 to 11. FIG.

Figure 9:
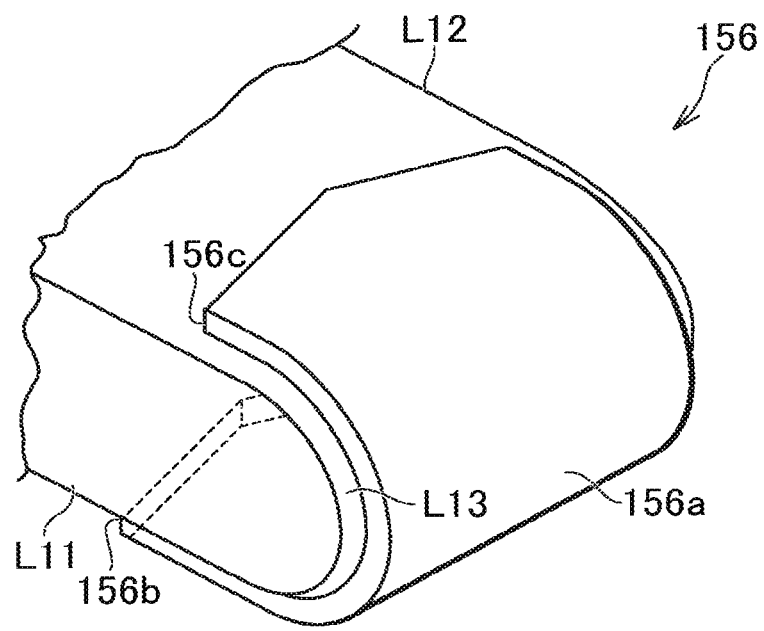
FIG. 9 is a perspective view of a part of a spacer in the second embodiment.
Figure 10:
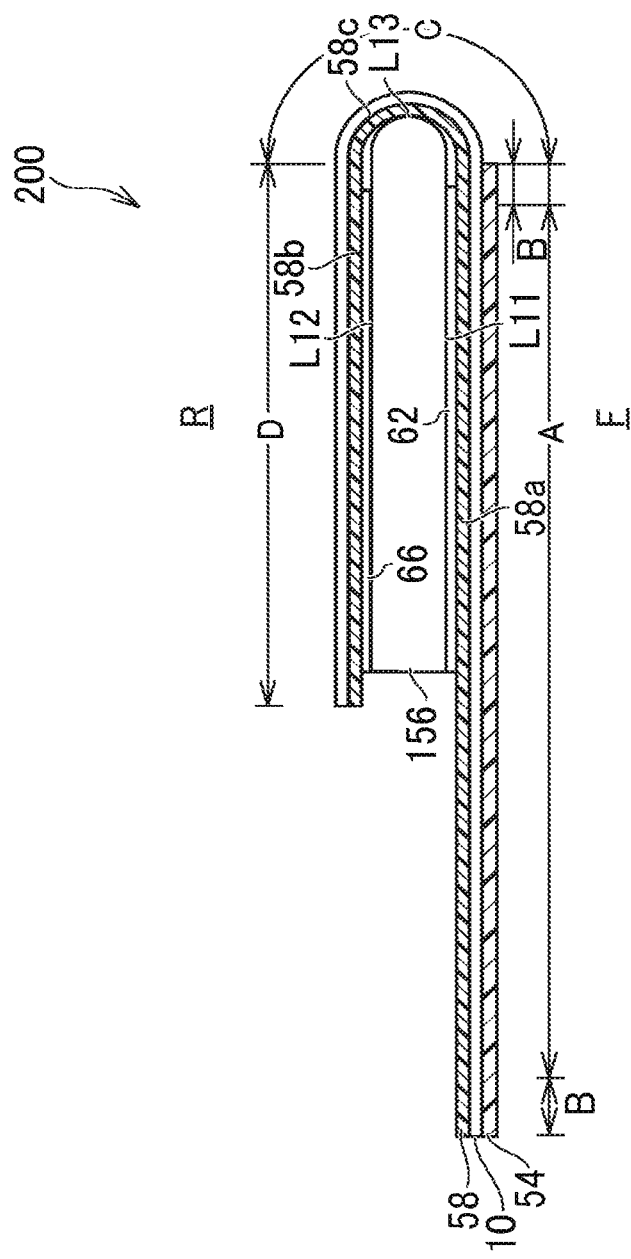
FIG. 10 is a cross sectional view along the line X-X in FIG. 8.
Figure 11:
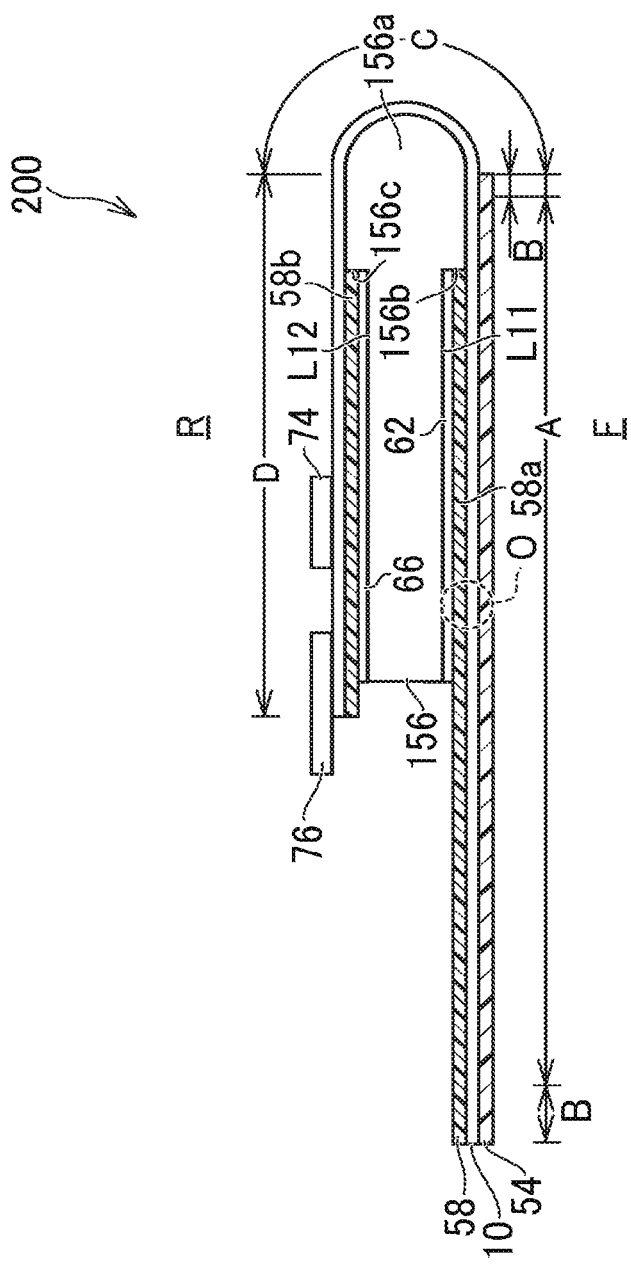
FIG. 11 is a cross sectional view along the line XI-XI in FIG. 8.

8 is a plan view of a display device according to the second embodiment viewed from the rear side. FIG. 9 is a perspective view of a part of a spacer according to the second embodiment. FIG. 10 is a cross sectional view along the line X-X in FIG. 8. FIG. 11 is a cross sectional view along the line XI-XI in FIG. 8. A structural component similar to one described in the first embodiment is given the same reference mark, and is not described again.

As illustrated in FIG. 9, a spacer 156 according to the second embodiment includes a guide portion 156a for guiding the bending area C of the flexible substrate 10 in bending, similar to the spacer 56 in the first embodiment. The spacer 156 includes a first base surface L11, a second base surface L12, and a third base surface L13. The first base surface L11 is recessed from the guide portion 156a as a result of formation of a first step 156b. The second base surface L12 is recessed from the guide portion 156a as a result of formation of a second step 156c. The third base surface L13 is flush with the first base surface L11 and the second base surface L12, and shaped in conformity with the shape of the guide portion 156a. Specifically, the first base surface L11 is the surface of the spacer 156 on the display side F. The second base surface L12 is the surface of the spacer 156 on the rear side R. The third base surface L13 is defined on each edge portion of the spacer 156 in the width direction.

The display device 200 includes the flexible substrate 10 and the rear reinforcement film 58 attached on the inside of the bending of the flexible substrate 10. The structure of the rear reinforcement film 58 is similar to that in the first embodiment. In the second embodiment, the first reinforcement 58a is attached on the first base surface L11; the second reinforcement 58b is attached on the second base surface L12; and the second reinforcement 58b is attached on the third base surface L13. FIG. illustrates a cross section passing through the second reinforcement 58c and the third base surface L13. FIG. 11 illustrates a cross section passing through the opening 58d and the guide portion 156a.

In the spacer 156, the rising face of the first step 156b has a shape in conformity with the shape of the end faces e1 and e2 of the first reinforcement 58a, while that of the second step 156c has a shape in conformity with the shape of the end faces e3 and e4 of the second reinforcement 58b (see FIG. 9).

In the display device 200 in the second embodiment, the guide portion 156a of the spacer 156 is indirect contact with the bending area C of the flexible substrate 10 through the opening 58d of the rear reinforcement film 58, as illustrated in FIG. 11. This structure leaves a smaller space between the flexible substrate 10 and the rear reinforcement film 58 and the spacer 156, as compared with the display device 100 according to the first embodiment, so that the flexible substrate 10 and the rear reinforcement film 58 can bend more stably. Furthermore, this structure unlikely generates load in the flexible substrate 10.

Although the end faces e1 and e2 of the first reinforcement 58a abut against the rising face of the first step 156b in the second embodiment, this is not an exclusive example, and the end faces e1 and e2 of the first reinforcement 58a may be spaced apart from the first step 156b. Similarly, the end faces e3 and e4 of the second reinforcement 58b may be spaced apart from a second step 156c.

The following describes modified examples of the rear reinforcement film. The rear reinforcement film may have any shape having an opening that becomes larger as it goes from the respective end sides to center thereof, besides the structure illustrated in FIG. 7. That is, the rear reinforcement film may have the structures illustrated in FIGS. 12 to 14. FIGS. 12 to 14 are plan views of modified examples of the rear reinforcement film.

As illustrated in FIG. 12, an end face of a rear reinforcement film 158 that defines an opening 158d may be a curved face, instead of a flat face, that smoothly extends while curving. Specifically, the opening 158d has a shape of which width becomes larger as it goes from the respective end sides to center of the reinforcement film 158. Thus, the width m12 at the center of the opening 158d of the reinforcement film 158 is larger than the width m11 at each end portion of the same. To employ the rear reinforcement film 158, the respective rising faces of the first step 156b and the second step 156c of the spacer 156 may have a smoothly curved shape in conformity with the shape of the end face of the rear reinforcement film 158 that defines the opening 158d.

As illustrated in FIG. 13, an end face of a rear reinforcement film 258 that defines an opening 258d may have a shape defined by a plurality of irregular concave and convex shapes (that is, a saw-toothed shape). That is, an end face of the rear reinforcement film that defines the opening may not be a smoothly extending face, such as is illustrated in FIGS. 7 and 12. In this modified example, in which the virtual area indicated by the long dashed double-short dashed line in FIG. 13 is defined as an opening 258d of the reinforcement film 258 for convenience in description, the opening 258d has a shape of which width becomes larger as it goes from the respective end sides to center of the reinforcement film 258. That is, the width m22 at the center of the opening 258d of the reinforcement film 258 is larger than the width m21 at each end portion of the same. To employ the rear reinforcement film 258, viscous resin may be filled in the space between the saw-teeth of the end face of the rear reinforcement film 258.

As illustrated in FIG. 14, an end face of a first reinforcement 358a of a rear reinforcement film 358 closer to the bending area C may partially have an abutting flat face e5 that extends vertically to the direction in which the stress caused by bending the flexible substrate 10 acts on. To employ the rear reinforcement film 358, the rising face of the first step 156b of the spacer 156 may partially have a linear portion in a plan view in conformity with the shape of the abutting flat face e5. With the above, positioning the spacer 156 relative to the flexible substrate 10 such that the abutting flat face e5 of the rear reinforcement film 358 abuts against the rising face of the first step 156b enables accurate positioning of the spacer 156 relative to the flexible substrate 10. Although the rear reinforcement film 358 in FIG. 14 corresponds to the rear reinforcement film 258 in FIG. 13 having the abutting flat face e5, the rear reinforcement film 58 in FIG. 7 or the rear reinforcement film 158 in FIG. 12 may have the abutting flat face e5.

The rear reinforcement films 58, 158, 258, 358 described in the embodiments and modified examples described above correspond to the reinforcement film according to the present invention.

While there have been described what are at present considered to be certain embodiments of the invention, it will be understood that various modifications may be made thereto, and it is intended that the appended claims cover all such modifications as fall within the true spirit and scope of the invention.

What is claimed is:
1. A display device comprising:
 a spacer;
 a flexible substrate on which a display area for image display, a frame area, a bending area, and a terminal area having a terminal are arranged in this order, and which includes a wire extending from the terminal area to the display area, the bending area being bent in conformity with a shape of the spacer to thereby place the terminal area on a rear side of the spacer; and a reinforcement film including
- a first reinforcement attached on a rear side of the display area,
- a second reinforcement attached on a display side of the terminal area,
- a bending reinforcement attached on respective both edge portions in a width direction of the flexible substrate on an inside surface side of the bending area, and
- an opening surrounded by the first reinforcement, the second reinforcement, and the bending reinforcement, wherein
the opening has a shape of which width becomes larger as the width goes from respective end sides to center in a width direction of the reinforcement film.

2. The display device according to claim 1, wherein end faces of the first reinforcement and the second reinforcement that define the opening are flat faces.

3. The display device according to claim 2, wherein the opening has a hexagonal shape.

4. The display device according to claim 1, wherein an angle formed by each of end faces of the first reinforcement and the second reinforcement that define the opening and an end face of the bending reinforcement that defines the opening is an obtuse angle.

5. The display device according to claim 1, wherein end faces of the first reinforcement and the second reinforcement that define the opening are curved faces.

6. The display device according to claim 1, wherein end faces of the first reinforcement and the second reinforcement that define the opening are faces that smoothly extend from the respective end sides to center of the reinforcement film.

7. The display device according to claim 1, wherein the opening has a symmetrical shape in the width direction of the reinforcement film.

8. The display device according to claim 1, wherein end faces of the first reinforcement and the second reinforcement that define the opening include a plurality of convex and concave shapes.

9. The display device according to claim 1, wherein
the spacer includes a guide portion for guiding the bending area in bending, a first base surface on which the first reinforcement which is recessed from the guide portion as a result of formation of a first step is attached, and a second base surface on which the second reinforcement which is recessed from the guide portion as a result of formation of a second step is attached, and
an end face of the first reinforcement that defines the opening partially has an abutting flat face for abutting against a rising face of the first step.

* * * * *